United States Patent
Suh et al.

(10) Patent No.: US 6,310,504 B1
(45) Date of Patent: Oct. 30, 2001

(54) DATA TRANSMISSION CIRCUIT FOR COMPENSATING DIFFERENCE OF SPEED

(75) Inventors: Young-Ho Suh, Suwon; Jin-Ho Lee, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/765,517

(22) Filed: Jan. 19, 2001

(30) Foreign Application Priority Data

Aug. 7, 2000 (KR) .................................................. 00-45597

(51) Int. Cl.[7] .................................................... H03H 11/26
(52) U.S. Cl. ........................................... 327/262; 327/378
(58) Field of Search .................................... 327/108, 142, 327/161, 261, 262, 362, 378, 379, 383, 398; 365/203

(56) References Cited

U.S. PATENT DOCUMENTS

| | | | |
|---|---|---|---|
| 4,189,751 | * 2/1980 | Nagumo | 358/213 |
| 5,936,441 | * 8/1999 | Kurita | 327/362 |
| 5,949,270 | * 9/1999 | Saito | 327/390 |
| 6,057,673 | * 5/2000 | Okayama | 323/207 |

* cited by examiner

Primary Examiner—My-Trang Nu Ton
(74) Attorney, Agent, or Firm—F. Chau & Associates, LLP

(57) ABSTRACT

A data transmission circuit is provided for compensating for a difference between data transmission speed occurring at start and end portions of a data line. The circuit minimizes a time delay caused by resistance/capacitance loading of the data line through which data is transmitted, thereby improving data transmission speed. The data transmission circuit of the present invention includes a compensation circuit to compensate for the time delay between the data signals at the start and end portions of the data line. The compensation circuit is adapted to amplify and rapidly develop a data signal at the end portion of the data line through which a data signal is enabled from its high state to its low state and transmitted as a data signal at the end portion of the data line.

11 Claims, 5 Drawing Sheets

DATA TRANSMISSION CIRCUIT FOR COMPENSATING DIFFERENCE OF SPEED

BACKGROUND OF THE INVENTION

1. Field of the Invention

The present invention relates to a data transmission circuit for compensating variations in data transmission speed between a start and an end portion of a data line. In particular, a circuit for minimizing time delay caused by resistive/capacitive loading of the data line through which data is transmitted.

2. Brief Description of the Prior Art

In development of a semiconductor device, a main issue concerns the development of integrated semiconductor devices of minimal size and capable of operating at high-speed.

When electronic devices operate at high speed, problems associated with high speed can occur. For example, a speed difference may occur at a data line having a large load. The speed difference may be due to a time delay in resistive/capacitive (RC) loading at the start and end portions of the data line connected with a driver output in transmission of data signals. Such a variation in speed is one factor lowering overall performance of semiconductor devices.

Variations in transmission speed caused by RC loading at the start and end portions of the data line connected with a driver output in transmission of data signals will be described in accordance with FIG. 1.

Referring to FIG. 1, the main data line driver 101 (hereinafter referred to as "MDL") is a driver for transmitting data signals, and a data line 102 transmits data signals sent from the MDL driver 101. MDL is a signal transmitted through the data line 102, including MDLn, a signal proximal to the MDL driver 101, and MDLf, a signal further from the MDL driver 101. In addition, MDL is pre-charged "high", which will be kept high by a latch part 103. When the MDL signal is enabled low, the latch part 103 turns "off", transmitting the MDL signal through the data line 102. The reset part 104 generates a signal RS-MDL1 to turn "on" a transistor T1 and pre-charge MDL "high" for a predetermined period of time after sensing that MDL is enabled low. The data line 102 connects the MDL driver 101 to a data output 105. At this time, if the data line 102 has a large loading capacity, there may be a time delay caused by RC, causing variation in the speed between MDLn and MDLf. FIG. 6 is a timing diagram of the signal of the circuit shown in FIG. 1 in which a speed difference occurs between MDLn and MDLf. As shown in FIG. 6, there is a time delay of $\Delta t$ between MDLn and MDLf. The occurrence of the speed difference as such, ultimately brings about a speed push, lowering overall performance of the semiconductor device.

A solution proposed in the prior art is shown in FIG. 2. FIG. 2 shows a structure of a data transmission circuit constructed to solve the aforementioned problem of the speed difference occurring in FIG. 1. A re-buffer 202 is used for amplifying MDL and compensating for the speed push in the first compared embodiment, thereby reducing the time delay $\Delta t$. In the data transmission circuit shown in FIG. 2, there is an advantage in that the speed push resulting from the difference in speed can be compensated for, improving overall performance of a semiconductor device. However, the circuit of FIG. 2 results in a larger chip with the addition of a re-buffer to the data transmission circuit to compensate for the speed push. In other words, re-buffers are added to all the data lines, resulting in a larger chip. As a result, the re-buffers are not suitable for miniaturization of a chip, and are limitedly to products whose performance is regarded as more important than the size of a chip.

SUMMARY OF THE INVENTION

The present invention provides a solution to the aforementioned problem. An object of the present invention is to provide a data transmission circuit for compensating for a difference between data transmission speed caused by RC loading that occurs at the start and end portions of a data line having a large loading capacity connected with a driver output in transmission of a data signal.

It is an object of the present invention to provide a data transmission circuit to improve overall performance of a semiconductor device as well as the speed of data transmission through a data line by minimizing a time delay caused by RC loading of the data line.

To accomplish the aforementioned objects of the present invention, there is provided a data transmission circuit including a driver for transmitting data signals, a data line through which the first data signal sent from the driver is transmitted into the second data signal, a compensation circuit for amplifying and developing the second data signal from its first state to its second state when the first data signal sent from the driver is enabled from its first state to its second state and transmitted through the data line to be the second data signal, a reset part for generating a pre-charge control signal by sensing that the first and second data signals are enabled to the second state thereof and delaying them for a predetermined period of time, and a pre-charge circuit for pre-charging the first and second data signals to its first state by the pre-charge control signal.

BRIEF DESCRIPTION OF DRAWINGS

For fuller understanding of the nature and objects of the present invention, reference should be made to the following detailed description taken in conjunction with the accompanying drawings in which.

DETAILED DESCRIPTION OF THE INVENTION

Figure 1:
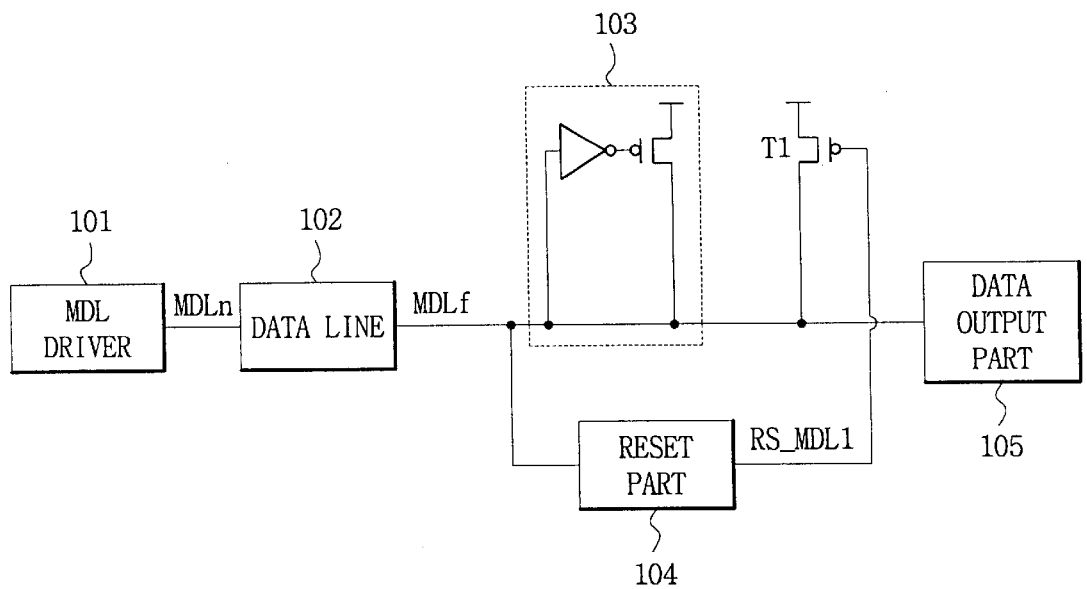
FIG. 1 illustrates a data transmission circuit in accordance with the prior art.
Figure 2:
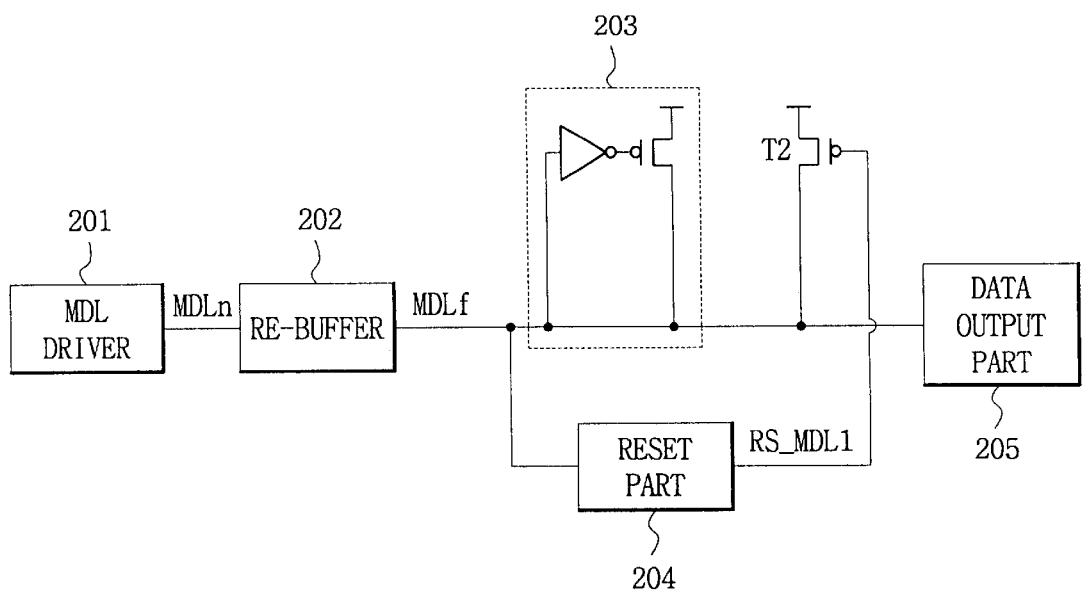
FIG. 2 illustrates a data transmission circuit using a re-buffer in accordance with the prior art.

Hereinafter, preferred embodiments of the present invention will be described in detail with reference to the accompanying drawings. It should be noted that the same parts are designated by different reference numerals in the preferred embodiments of the present invention and that like reference numerals are used to designate equivalent parts even if they are shown in the different drawings and embodiments of the present invention. Also, a number of specific details about specific design structures will be shown below to provide better overall understandings. It is clearly understood to those skilled in this technological field that all details may not be required for implementation of the present invention. Furthermore, the detailed descriptions about well-known functions and structures, which may unnecessarily make the key points of the present invention unclear, will be omitted.

Figure 7:
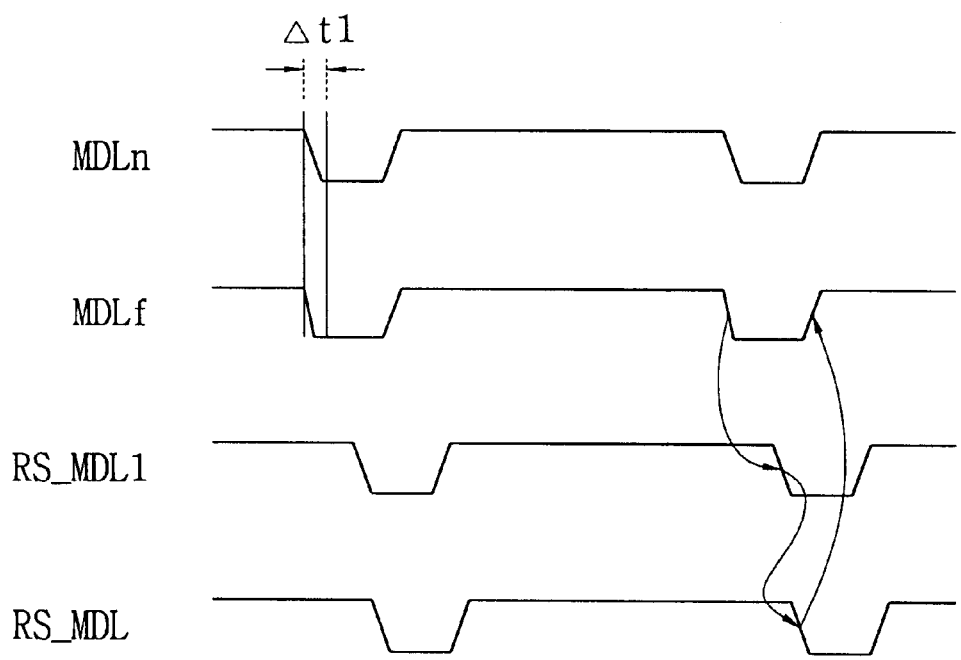
FIG. 7 is a timing diagram of signals of the present invention.

The present invention proposes a data transmission circuit for minimizing a speed push without burdening chip size (e.g., making the chip larger). In other words, the present invention discloses a data transmission circuit that can minimize a time delay caused by RC of a data line through which data is transmitted. Hereinafter, preferred embodiments of the present invention will be described with reference to FIGS. 3, 5, and 7.

Figure 3:
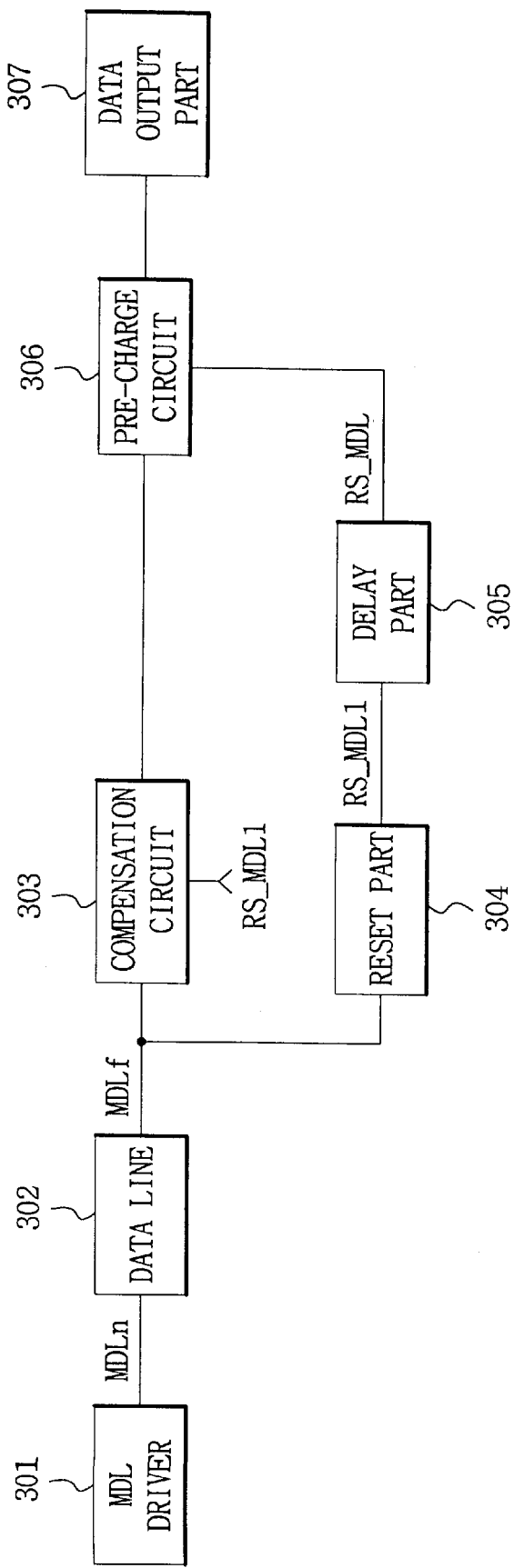
FIG. 3 is a block diagram of a data transmission circuit in accordance with the present invention.

FIG. 3 is a block diagram illustrating a data transmission circuit in accordance with the present invention, including: MDL driver 301; data line 302; compensation circuit 303; reset part 304; delay part 305; pre-charge part 306; and data output part 307.

The MDL driver 301 generates a signal, MDL. The data line 302 transmits MDLn, a signal sent from the MDL driver 301, to MDLf.

The compensation circuit 303 amplifies MDLf to rapidly develop into a low signal when a high state of MDLn sent from MDL driver 301 is enabled low and transmitted through the data line 302 to MDLf. The reset part 304 generates a RS-MDL1, a signal to pre-charge MDLn/MDLf into a "high" state thereof by sensing that MDLn/MDLf is enabled low and delaying for a predetermined period of time.

At this time, the RS-MDL1 signal is received at the delay part 305, delayed for a predetermined period of time, and output as RS-MDL.

The delay part 305 generates RS-MDL after delaying RS-MDL1 for the predetermined period of time to prevent the compensation circuit 303 from disturbing the pre-charge of MDL.

The pre-charge circuit 306 pre-charges MDL according to RS-MDL, a pre-charge controlling signal.

The data output part 307 outputs MDL whose speed is compensated for by the compensation circuit 303.

Figure 4:
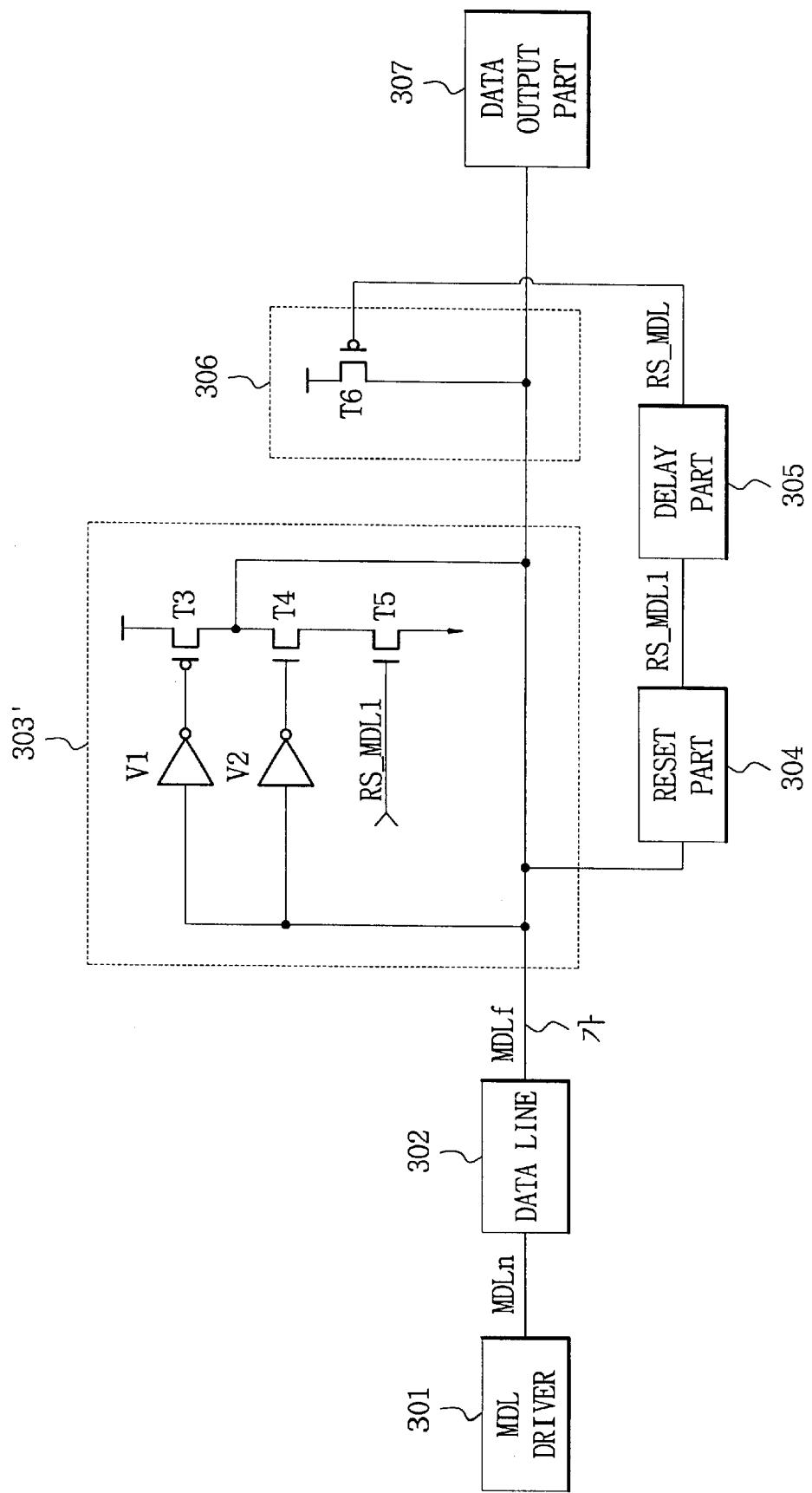
FIG. 4 is a data transmission circuit having a compensation circuit in accordance with a preferred embodiment of the present invention.

FIG. 4 illustrates a data transmission circuit including a compensation circuit in accordance with a preferred embodiment of the present invention. The compensation circuit 303 includes an inverter V1 similar to the latch part in the first compared embodiment, an inverter V2 at a PMOS transistor T3, and NMOS transistors T4 and T5 to compensate for the time delay caused by RC loading.

Hereinafter, the structure of the data transmission circuit will be described in detail in accordance with preferred embodiments of the present invention.

In the data transmission circuit, an output of the MDL driver 301 is input to the data line 302, and an output of the data line 302 is connected with a data output part 307 through node 'A'. A reset part 304 is connected in parallel with node A, a connection node between the data line 302 and the data output part 307, and a delay part 305 connected with the reset part 304. An output of the delay part 305 is connected with a gate of a PMOS transistor of the pre-charge circuit 306. In the pre-charge circuit 306, supply power is input to a source of T6, and a drain of T6 is connected to node 'A'. A compensation circuit 303 is connected in parallel with the node 'A', and the compensation circuit 303 is constructed in the following structure.

An anode of an inverter V1 is connected to an end of the node 'A', and a cathode of the inverter V1 is connected to the gate of a PMOS transistor T3. The source and drain of the PMOS transistor T3 are respectively connected with a supply voltage near the rear end of node 'A'. Also, an anode of an inverter V2 is connected between node 'A' and the connection line of inverter V1. The drain of NMOS transistor T4 is connected between the drain of the PMOS transistor T3 and node 'A'. The drain of an NMOS transistor T5 is connected to the source of the NMOS transistor T4. The source of the NMOS transistor T5 is grounded, and the gate of the NMOS transistor T5 is connected to the input of RS-MDL1 sent from the reset part 304.

An output signal of the MDL driver 301 is MDLn, and an output signal of the data line 302 is MDLf. An output signal of the reset part 304 is RS-MDL1 and an output signal of the delay part 305 is RS-MDL.

At this time, the signals used in the present invention will be defined again. MDLn is a low enabling signal that generates proximal to the MDL driver 301. MDLf is a low enabling signal that generates further from the MDL driver 301. A RS-MDL1 signal pre-charges MDL "high" after receiving the developing MDL signal, delaying MDL for a predetermined period of time. RS-MDL is a signal after delaying RS-MDL1 for a predetermined period of time.

Operations of the data transmission circuit will be described in detail in accordance with preferred embodiments of the present invention.

After sensing that a MDLf transmitted through the data line 302 is enabled low, the reset part 304 turns on transistor T6 of the pre-charge circuit 306 after a predetermined period of time, thereby pre-charging MDL "high". If transistor T6 is turned on pre-charging MDL "high", a latch including inverter V1 and transistor T3 sustains the "high" state of MDL.

If the high state of MDLn is enabled low, the MDL signal transmits to MDLf through the data line 302. Then, MDLf transmits through the data line 302 to make the output of inverter V1 of the compensation circuit 303 "high" and to turn transistor T3 "off", thereby preventing operations of the latch. On the other hand, there may be a long time delay for MDL while it transmits through the data line 302, particularly between at the start and end of the data line due to the time delay caused by RC loading in a low slope. The compensation circuit 303 minimizes such a time delay. In other words, when MDLn transmits through the data line 302 and MDLF inputs to inverter V2, the output of inverter V2 turns "high" to turn transistor T4 "on". At this time, the input signal of RS-MDL1 is kept at its "high" state to turn transistor T5 "on". Therefore, since both transistors T4 and T5 are kept "on", MDLf is amplified once more by transistors T4 and T5. Thus, MDLf develops into "low", forming a steep slope. In other words, the steep slope means that the speed increases when MDLf is enabled low, compensating for the speed difference between MDLn and MDLf. In other words, as shown in the timing view of FIG. 7, it can be noted that, in compensating for the speed difference between MDLn and MDLf, the time delay Δt1 of the present invention is smaller than the Δt of the first compared embodiment.

After completion of MDL, RS-MDL1 is enabled by receiving MDL to turn transistor T5 "off", and delay RS-MDL1 for a predetermined period of time by the delay part 305 is then input into transistor T6 to pre-charge MDL signal "high". Transistor T5 is turned "off" first, and after a predetermined period of time between RS-MDL1 and RS-MDL, transistor TG turns "on", to prevent transistor T5 from being disturbed in the process of pre-charging the transistor T6.

Figure 5:
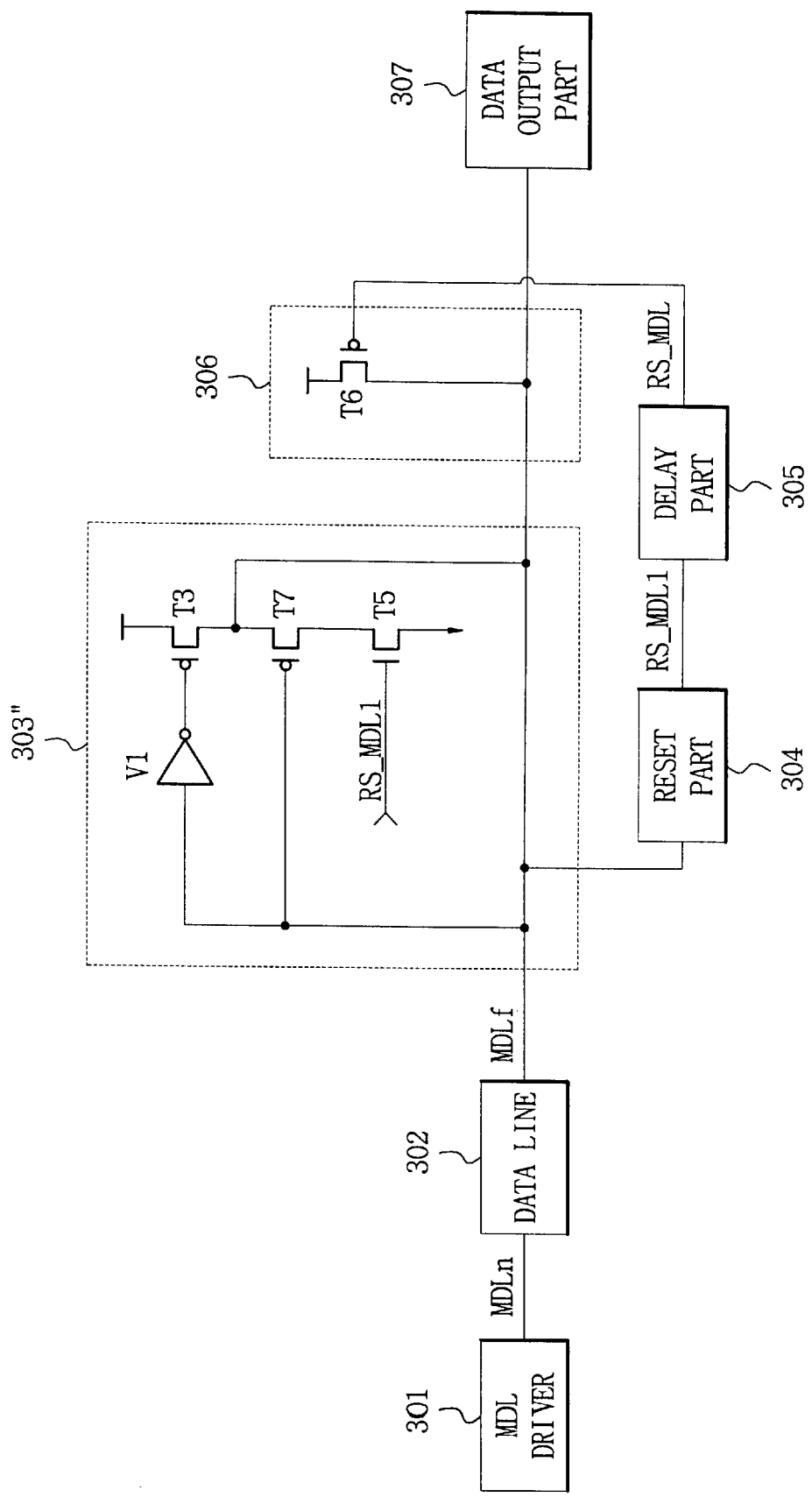
FIG. 5 illustrates a data transmission circuit having a compensation circuit in accordance with another preferred embodiment of the present invention.
Figure 6:
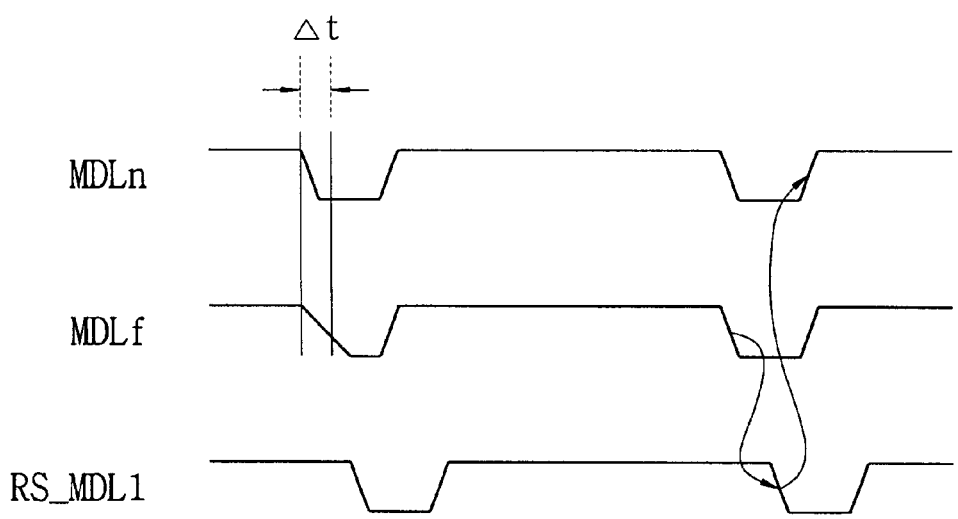
FIG. 6 is a timing diagram of signals of the prior art.

FIG. 5 illustrates a data transmission circuit having a compensation circuit in accordance with an embodiment of the present invention. In comparison with the compensation circuit 303' of FIG. 4, a compensation circuit 303" is constructed by removing inverter V2 and replacing NMOS transistor T4 with a PMOS transistor T7. At this time, all the operations of the compensation circuit shown in FIG. 5 are similar to those in the preferred embodiment of FIG. 4 and the signal timing view shown in FIG. 7. Therefore, in a preferred embodiment of the present invention, the compensation circuit 303 can also compensate for the speed difference between MDLn and MDLf more effectively than in the compared embodiments.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

As described above, there is an advantage in the present invention in that a data transmission circuit is constructed for compensating a difference in data transmission speed occurring at the start and end portions of a data line connected to the output of a driver when a data signal is transmitted through the data line having a large loading to minimize the time delay caused by RC of the data line, thereby improving the speed of data transmission without any burden in the size of a chip.

What is claimed is:

1. A data transmission circuit comprising:
   a driver for transmitting data signals;
   a data line through which a first data signal sent from the driver is transmitted to a second data signal;
   a compensation circuit for amplifying and developing the second data signal from its first state to its second state when the first data signal sent from the driver is enabled from its first state to its second state and transmitted through the data line to be the second data signal;
   a reset part for generating a pre-charge control signal by sensing that the first and second data signals are enabled to the second state thereof; and
   a delay circuit for generating a second precharge control signal by delaying the precharge control signal generated from the reset part for a predetermined period of time; and
   a pre-charge circuit for precharging the first and second data signals to the first state thereof by the second pre-charge control signal.

2. The data transmission circuit of claim 1, wherein the compensation circuit also includes a compensation part for blocking the compensation circuit from disturbing the pre-charge operation by sending the second pre-charge control signal that generates after delaying the pre-charge control signal of the reset part for a predetermined period of time.

3. The data transmission circuit of claim 1, wherein the first data signal is an enable signal that is generated proximal to the driver, and the second data signal is an enable signal that is generated further from the driver.

4. The data transmission circuit of claim 1, wherein first state means high and the second state means low.

5. The data transmission circuit of claim 1, wherein the pre-charge control signal is to pre-charge the first and second data signals to the first state thereof by enabling and delaying for a predetermined period of time when the first and second data signals develop into the second state thereof.

6. The data transmission circuit of claim 5, wherein the compensation circuit is a data line transmission circuit comprising:
   a latch circuit for keeping the first state of the data signal when it is pre-charged to its first state and to stop its operations when the data signal is enabled to its second state; and
   an amplifying circuit including a first transistor to be turned on by an inverter which outputs the first state of the data signal when the second data signal is inputted, and a second transistor to be turned on at the first state of the pre-charge control signal of the reset part, for amplifying and developing the second data signal into its low state when all first and second transistors are turned on.

7. The data transmission circuit of claim 5, wherein the compensation circuit is a data line transmission circuit comprising:
   a latch circuit for keeping the first state of the data signal when it is pre-charged to its first state and to stop its operations when the data signal is enabled to its second state;
   an amplifying circuit constructed with a first transistor to be turned on when the second data signal is inputted, and a second transistor to be turned on at the first state of the pre-charge control signal of the reset part, for amplifying and developing the second data signal into its low state when all the second and second transistors are turned on.

8. A data transmission circuit comprising:
   a main data line driver for transmitting main data line signals;
   a data line through which a first main data line signal sent from the main data line driver is transmitted into the second main data line signal;
   a latch circuit for keeping the high state of the first main data line signal data signal data signal when it is pre-charged to its high state or to stop its operations when the data signal is enabled to its low state;
   an amplifying circuit for amplifying the second main data line signal at the high state of a first pre-charge control signal, and develop the second main data line signal from its high state to its low state when the first main data line signal sent from the main data line driver is enabled from its high state to its low state and transmitted through the data line as the second main data line signal;
   a reset part for generating the first pre-charge control signal by sensing that the first and second main data line signals are enabled to their low state, and delay them for a predetermined period of time;
   a delay part for generating a second precharged control signal by delaying the first pre-charge control signal generated from the reset part for a predetermined period of time; and
   a pre-charge circuit for pre-charging the first and second main data line signals to their high state by the second pre-charge control signal.

9. The data transmission circuit of claim 8, wherein the amplifying circuit including the first transistor turned on by an inverter outputting the high state of the second main data line signal when it is inputted, and the second transistor turned on at the high state of the first pre-charge control signal of the reset part, for amplifying and developing the second main data line signal into its low state when all the first and second transistors are turned on.

10. The data transmission circuit of claim 8, wherein the amplifying circuit includes a first transistor turned on by an inverter outputting the high state of the second main data line signal when it is inputted, and a second transistor to be turned on at the high state of the first pre-charge control signal of the reset part, for amplifying and developing the second main data line signal to its low state when all the first and second transistors are turned on.

11. The data transmission circuit of claim 8, wherein the first main data line signal is an enable signal that is generated proximal to the main data line driver, and the second data signal is an enable signal that generated further from the main data line driver.

* * * * *